(12) United States Patent
Eguchi et al.

(10) Patent No.: US 8,455,767 B2
(45) Date of Patent: Jun. 4, 2013

(54) PRINTED CIRCUIT BOARD MODULE

(75) Inventors: Susumu Eguchi, Kawasaki (JP);
Kazuhiko Itakura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/218,017

(22) Filed: Aug. 25, 2011

(65) Prior Publication Data

US 2011/0308839 A1 Dec. 22, 2011

Related U.S. Application Data

(63) Continuation of application No. PCT/JP2009/054049, filed on Mar. 4, 2009.

(51) Int. Cl.
*H05K 1/03* (2006.01)

(52) U.S. Cl.
CPC .................................. *H05K 1/03* (2013.01)
USPC ........................................ 174/255; 361/760

(58) Field of Classification Search
CPC ......... H05K 3/366; H05K 1/141; H05K 3/301; H05K 3/3405; H05K 3/3421; H05K 2201/1034; H05K 2201/10424
USPC .............. 361/760, 768, 788; 174/250, 255; 439/59, 79–80
See application file for complete search history.

(56) References Cited

U.S. PATENT DOCUMENTS

| 6,815,614 | B1* | 11/2004 | Keating et al. ............... 174/535 |
| 7,985,075 | B2* | 7/2011 | Chang ............................. 439/59 |
| 2005/0168961 | A1* | 8/2005 | Ono et al. ...................... 361/784 |
| 2006/0049777 | A1 | 3/2006 | Kumagai et al. |
| 2008/0139013 | A1* | 6/2008 | Tomura et al. .................. 439/65 |

FOREIGN PATENT DOCUMENTS

| JP | 4-59971 | 5/1992 |
| JP | 5-28067 | 4/1993 |
| JP | 6/17269 | 4/1994 |
| JP | 2000-208819 | 7/2000 |
| JP | 2004-153178 | 5/2004 |
| JP | 2005-150498 | 6/2005 |
| JP | 2006-024746 | 1/2006 |
| JP | 2006-173152 | 6/2006 |

* cited by examiner

*Primary Examiner* — Yuriy Semenenko
(74) *Attorney, Agent, or Firm* — Staas & Halsey LLP

(57) ABSTRACT

As a base, a side wall, and a top board are integrated by integral molding in a printed circuit board module, the printed circuit board module is structured in a simple manner. Further, conductive terminals are used for fitting a printed circuit board. The printed circuit board is securely held between the electrically conductive terminals and the top board via an elasticity of the conductive terminals. Here, due to the functioning of the notches, the printed circuit board is positioned in a simple manner. Due to the functioning of the base, a printed circuit board module can stand erect. The printed circuit board establishes a vertical posture. The packaging area is reduced. The packaging density improves. Further, the flat surface of the top board that is formed facing upward with a certain extension is used as, for example, an absorbent face.

4 Claims, 19 Drawing Sheets

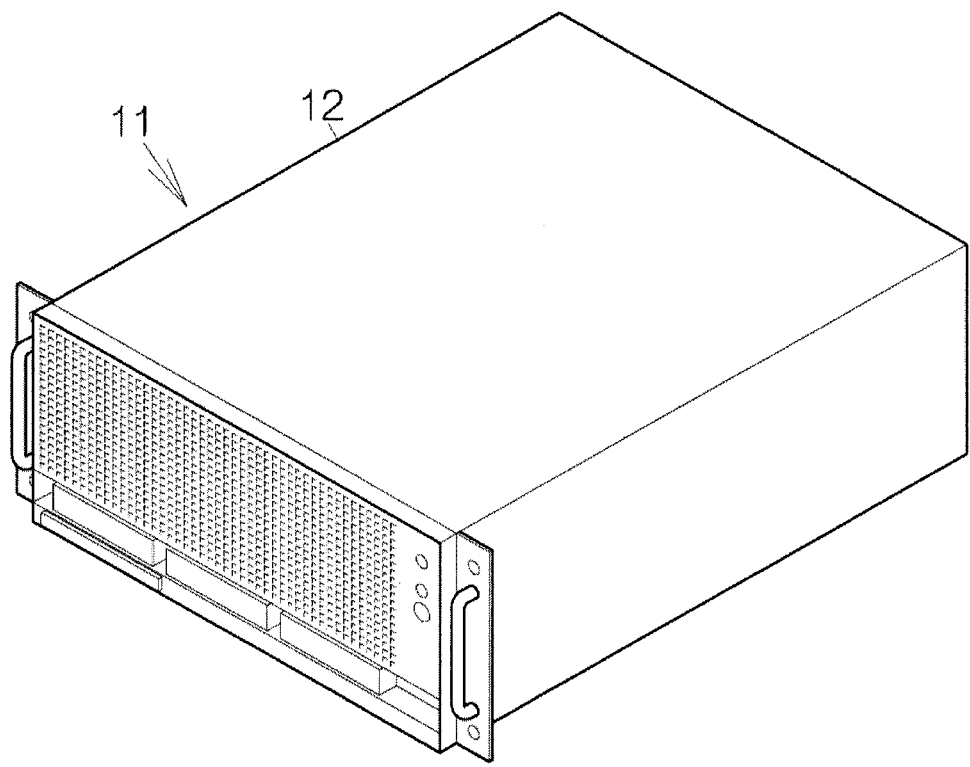
F I G. 1

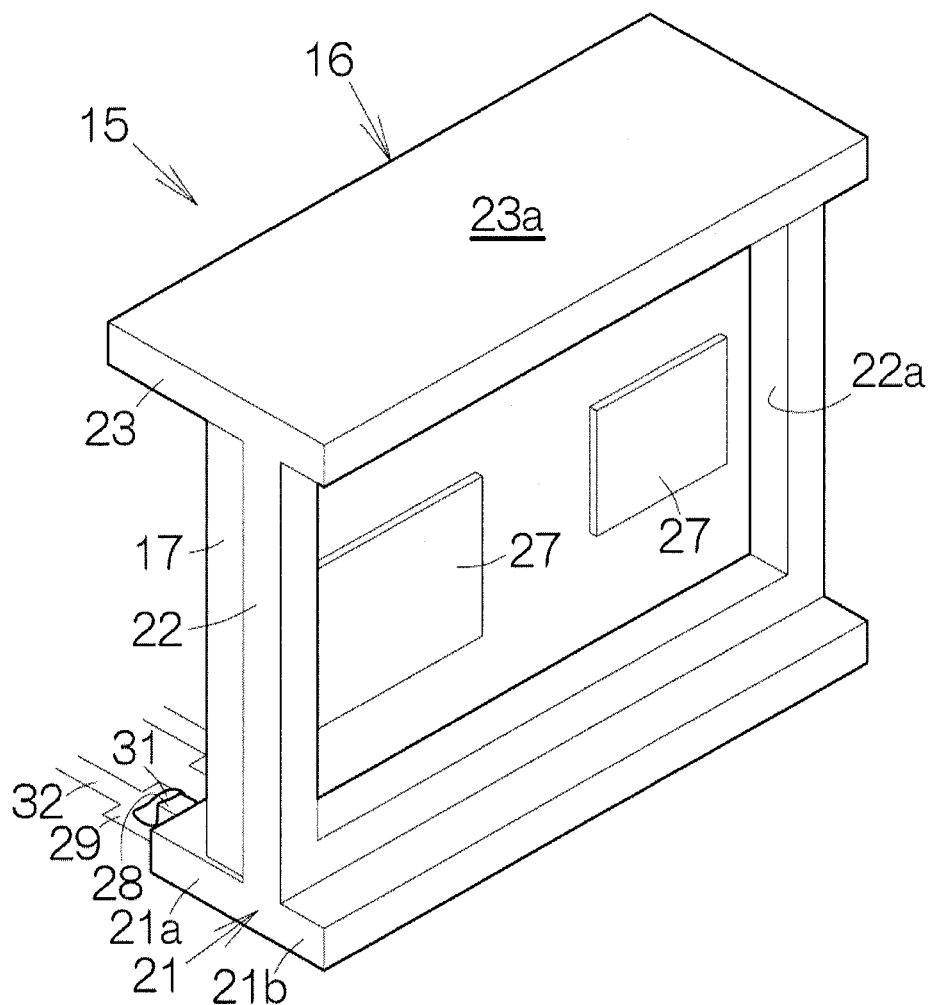
F I G. 4

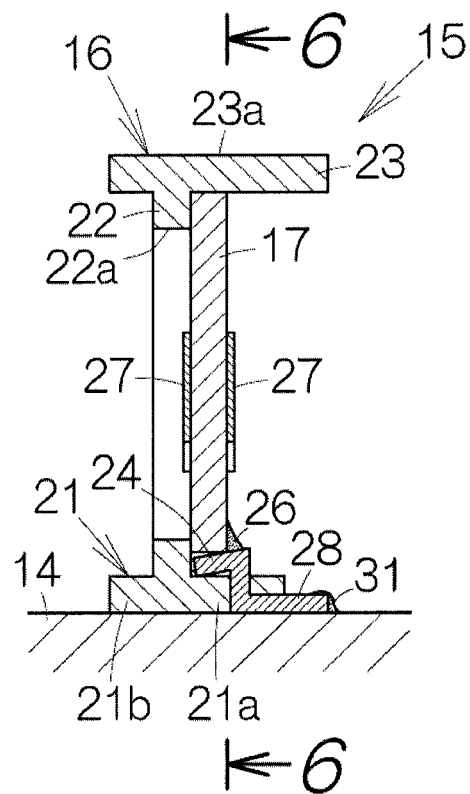
F I G. 5

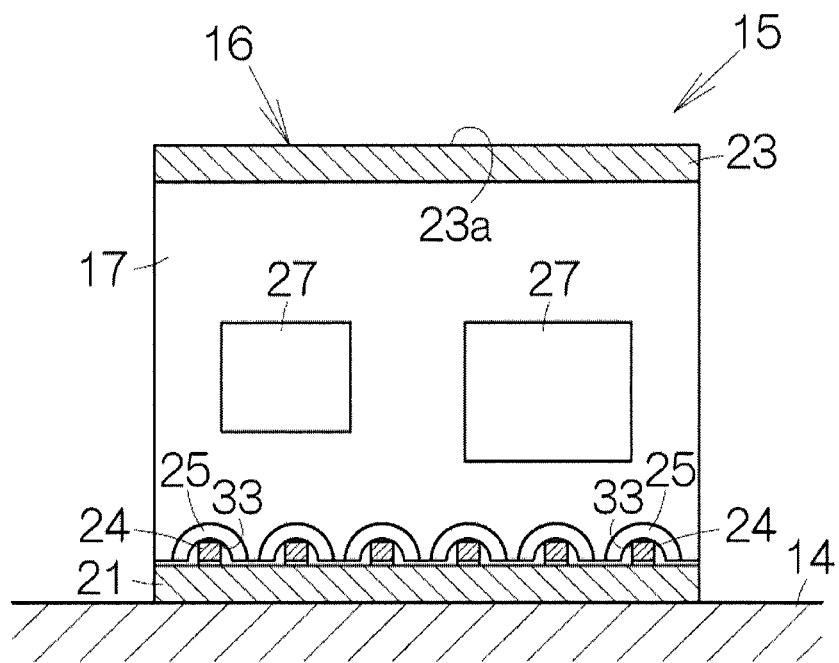
F I G. 6

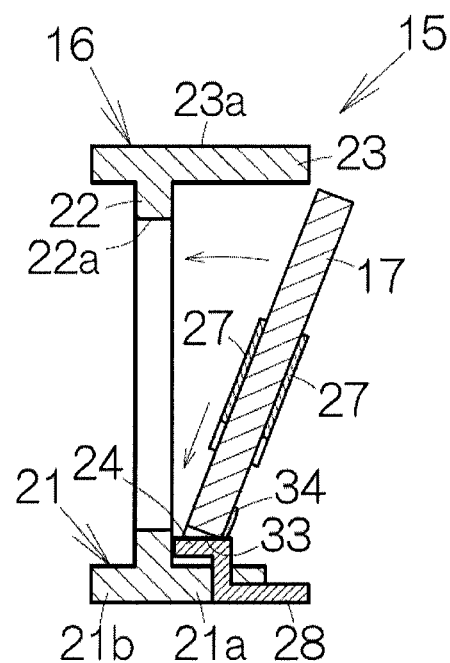
F I G. 7

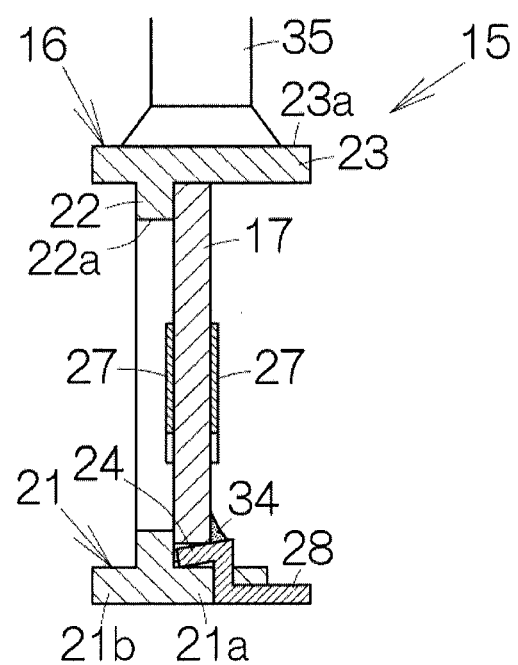
F I G. 8

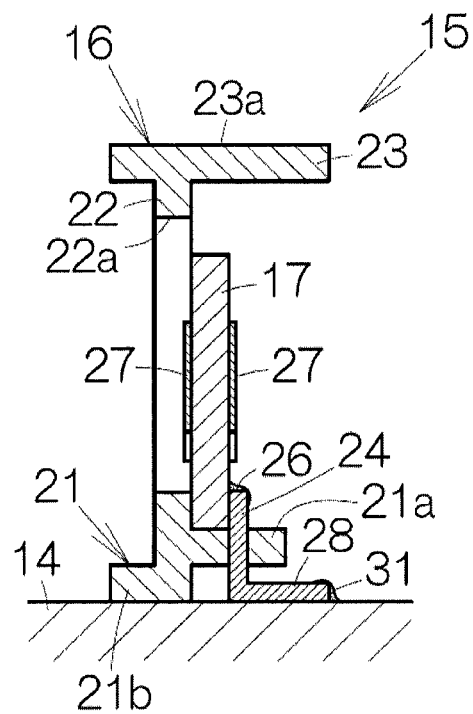
F I G. 10

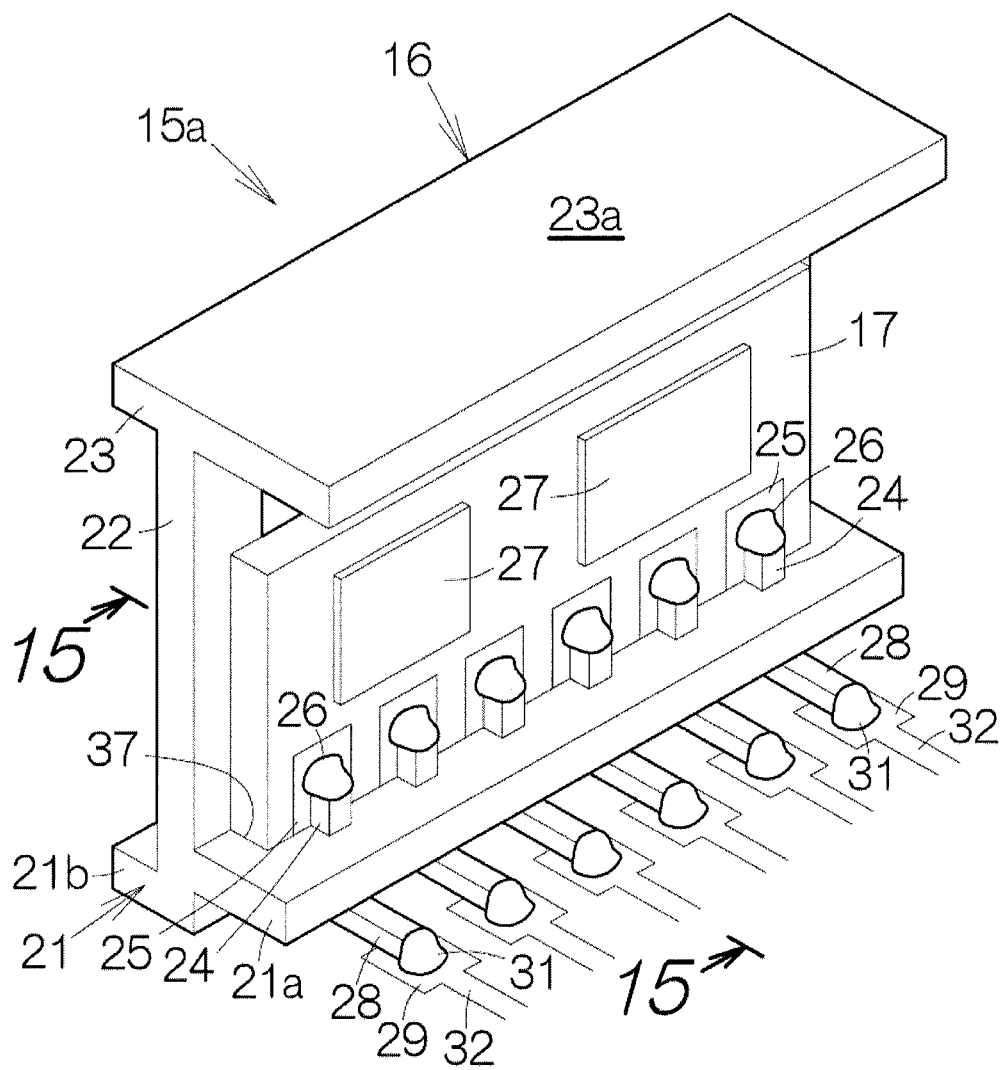
F I G. 1 4

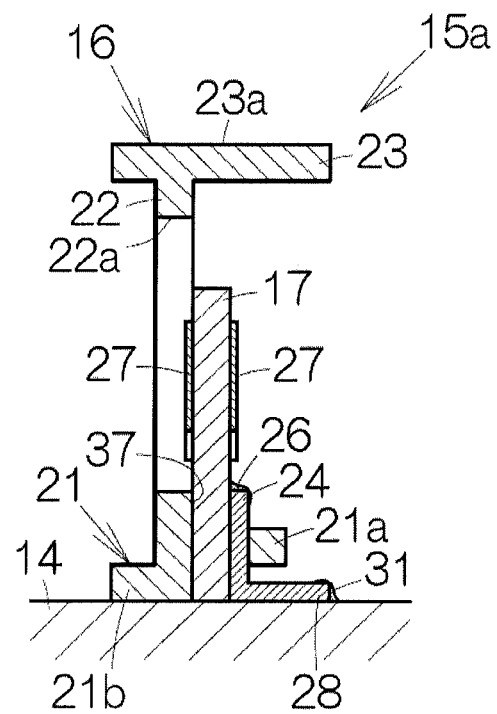
F I G. 15

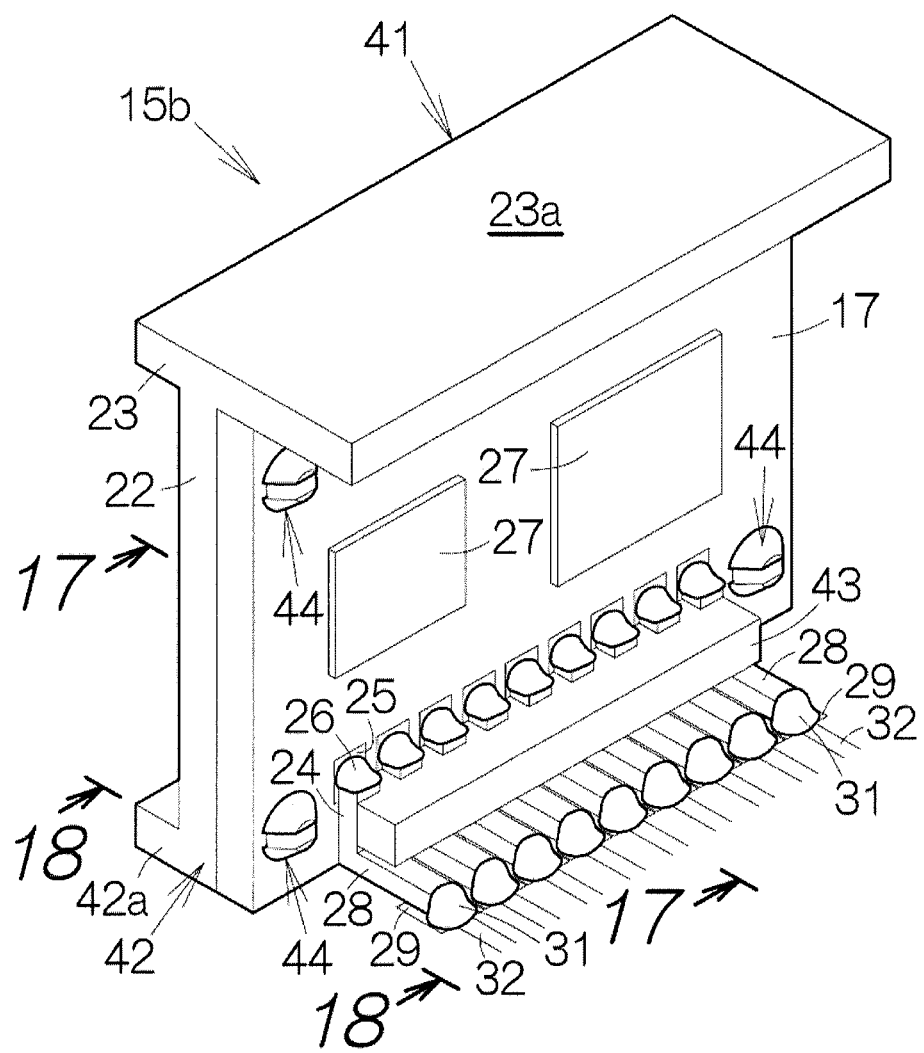
F I G. 16

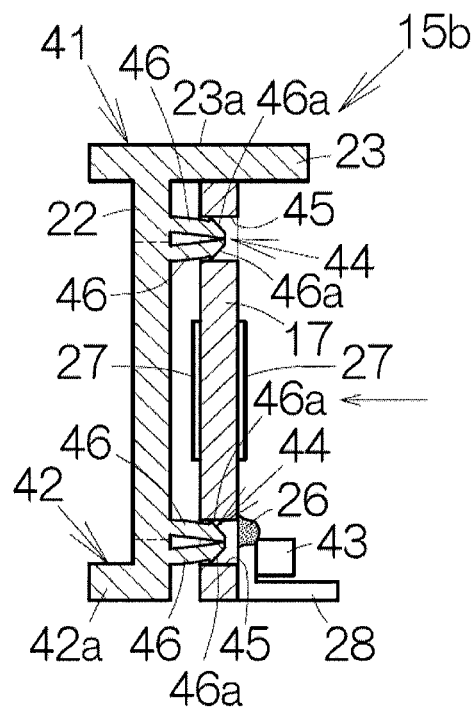
F I G. 19

PRINTED CIRCUIT BOARD MODULE

CROSS-REFERENCE TO RELATED APPLICATION

This application is a continuation of PCT application PCT/JP2009/054049 filed on Mar. 4, 2009, the entire contents of which are incorporated herein by reference.

FIELD

The embodiments discussed herein are related to a printed circuit board module.

BACKGROUND

A printed circuit board module is surface-implemented on, for example, a printed wiring board of a motherboard. The printed circuit board module is provided with a printed circuit board such as a memory board. On one side face of a memory board, a first mold that includes surface-implemented terminals is provided. On the other side face of a memory board, a second mold is provided, where the memory board is sandwiched between the first mold and the second mold. Due to the first and second molds, the printed circuit board can stand erect. On, for example, the top end of a memory board, a cap that defines a flat absorbent face is attached for the absorption by a robot.

Patent Document 1:
Japanese Patent Application No. 2006-024746
Patent Document 2:
Japanese Patent Application No. 2004-153178
Patent Document 3:
Japanese Patent Application No. 2006-173152
Patent Document 4:
U.S. Pat. No. 6,815,614

SUMMARY

In the assembly of a printed circuit board module, first, a first mold and a second mold are attached to both side faces of a memory board. The surface-implemented terminals of a first mold at one side are soldered to the conductive pads on a memory board by a ref lowing process. After that, a cap is attached to the top end of a memory board. As such a printed circuit board module requires a large number of components, the structure of a printed circuit board module tends to be complex. Several processes need to be performed in order to assemble a printed circuit board module.

The present invention has been made in view of the above situation, and it is an object of the present invention to provide a printed circuit board module that can be structured in a simple manner.

In order to achieve the above-mentioned object, an example of a printed circuit board module is provided with a base made of resin; a side wall made of resin standing erect on the base and integrated with the base by integral molding; a top board made of resin forming an upward-facing flat surface with a certain extension, forming a certain space between the top board and the base, and integrated with the side wall by integral molding; an elastic conductive terminal protruding from a surface of the base; and a printed circuit board accommodated in the certain space and fitted in between the conductive material and the top board in a vertical posture via the elasticity of the conductive material.

According to such a printed circuit board module, a base, a side wall, and a top board are integrated by integral molding, and thus a printed circuit board module can be structured in a simple manner. Further, conductive terminals are used to fit a printed circuit board. The printed circuit board is securely held between the conductive terminals and the top board by the elasticity of the conductive terminals. Moreover, due to the function of the base, the printed circuit board module can stand erect. The packaging area is reduced. The packaging density improves. Further, the flat surface of a top board that is formed facing upward with a certain extension is used as, for example, an absorbent face.

Another example of a printed circuit board module is provided with a base made of resin; a side wall made of resin standing erect on the base and integrated with the base by integral molding; a top board made of resin forming an upward-facing flat surface with a certain extension, forming a certain space between the top board and the base, and integrated with the side wall by integral molding; an elastic conductive terminal protruding from a surface of the base; and a printed circuit board accommodated in the certain space and fitted in between the conductive material and the top board in a vertical posture via the elasticity of the conductive material.

According to such a printed circuit board module, a base, a side wall, and a top board are integrated by integral molding, and thus a printed circuit board module can be structured in a simple manner. Further, conductive terminals are used to fit a printed circuit board. The printed circuit board is securely held between the conductive terminals and the top board by the elasticity of the conductive terminals. Moreover, due to the function of the base, the printed circuit board module can stand erect. The packaging area is reduced. The packaging density improves. Further, the flat surface of a top board that is formed facing upward with a certain extension is used as, for example, an absorbent face.

Further, another example of a printed circuit board module is provided with a base having a first support foot; a side wall standing erect on the base and integrated with the base by integral molding; a top board forming an upward-facing flat surface with a certain extension and integrated with the side wall by integral molding; a printed circuit board extending from the top board to the base and held on the side wall; and a second support foot fixed on a surface of the printed circuit board enabling the base to stand erect in cooperation with the first support foot.

According to such a printed circuit board module, a base, a side wall, and a top board are integrated by integral molding, and thus a printed circuit board module can be structured in a simple manner. Further, due to the co-operation between the first and second support feet, a base, that is, a printed circuit board module, can stand erect. The printed circuit board establishes a vertical posture. The packaging area is reduced. The packaging density improves. Further, the flat surface of a top board that is formed facing upward with a certain extension is used as, for example, an absorbent face.

BRIEF DESCRIPTION OF DRAWINGS

FIG. 1 is a perspective view schematically illustrating an external view of an example of electronic equipment, i.e., a server computer.

FIG. 4 schematically illustrates an external view of the structure of a printed circuit board module according to the first embodiment of the present invention.

FIG. 5 is a section 5-5 of FIG. 3.

FIG. 6 is a section 6-6 of FIG. 5.

FIG. 7 is a section view schematically illustrating how a printed circuit board is fitted into a mold.

FIG. 8 is a section view schematically illustrating how an automatic implementation robot absorbs the flat surface of a top board.

FIG. 10 is a section 10-10 of FIG. 9.

FIG. 14 schematically illustrates an external view of the structure of a printed circuit board module according to another modification of the second embodiment of the present invention.

FIG. 15 is a section 15-15 of FIG. 14.

FIG. 16 schematically illustrates an external view of the structure of a printed circuit board module according to the third embodiment of the present invention.

FIG. 19 is a section view schematically illustrating how a printed circuit board is fitted into a mold.

DESCRIPTION OF EMBODIMENTS

Some embodiments of the present invention will be described with reference to the accompanying drawings.

FIG. 1 schematically illustrates an external view of an example of electronic equipment, i.e., a server computer 11. The server computer 11 is provided with a cabinet 12. In the cabinet 12, the accommodating space is partitioned. A motherboard is arranged in the accommodating space. A semiconductor component such as an electronic component package or main memory is implemented on the motherboard. An electronic component package executes various kinds of arithmetic processing on the basis of, for example, the software program or data that is temporarily stored in a main memory. The software program or data may be stored in the mass storage such as a hard disk drive (HDD) that is arranged in the accommodating space in a similar manner. The server computer 11 of such type is arranged, for example, on a rack.

Figure 2:
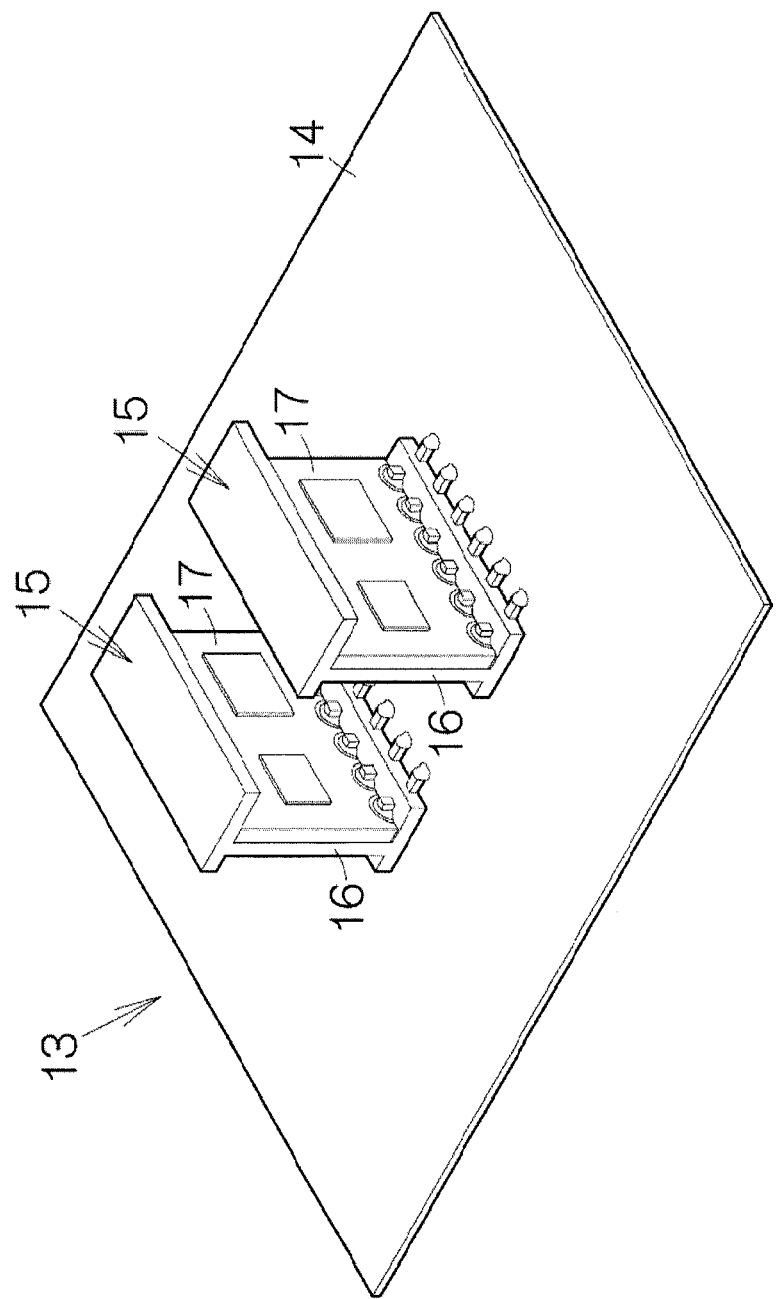
FIG. 2 schematically illustrates an external view of an example of a printed circuit board unit, i.e., the structure of a motherboard according to the present invention.

FIG. 2 schematically illustrates an external view of a printed circuit board unit, i.e., a motherboard 13 according to the present invention. The motherboard 13 is provided with a large printed wiring board 14. The printed wiring board 14 is made of, for example, a resin substrate. On the flat surface of the printed wiring board 14, a surface-mountable printed circuit board module 15 is implemented. The printed circuit board module 15 is provided with a mold 16 that stands erect on the surface of the printed wiring board 14. A printed circuit board 17 is held on the mold 16. The printed circuit board 17 stands erect on the surface of the printed wiring board 14 in a vertical posture.

Figure 3:
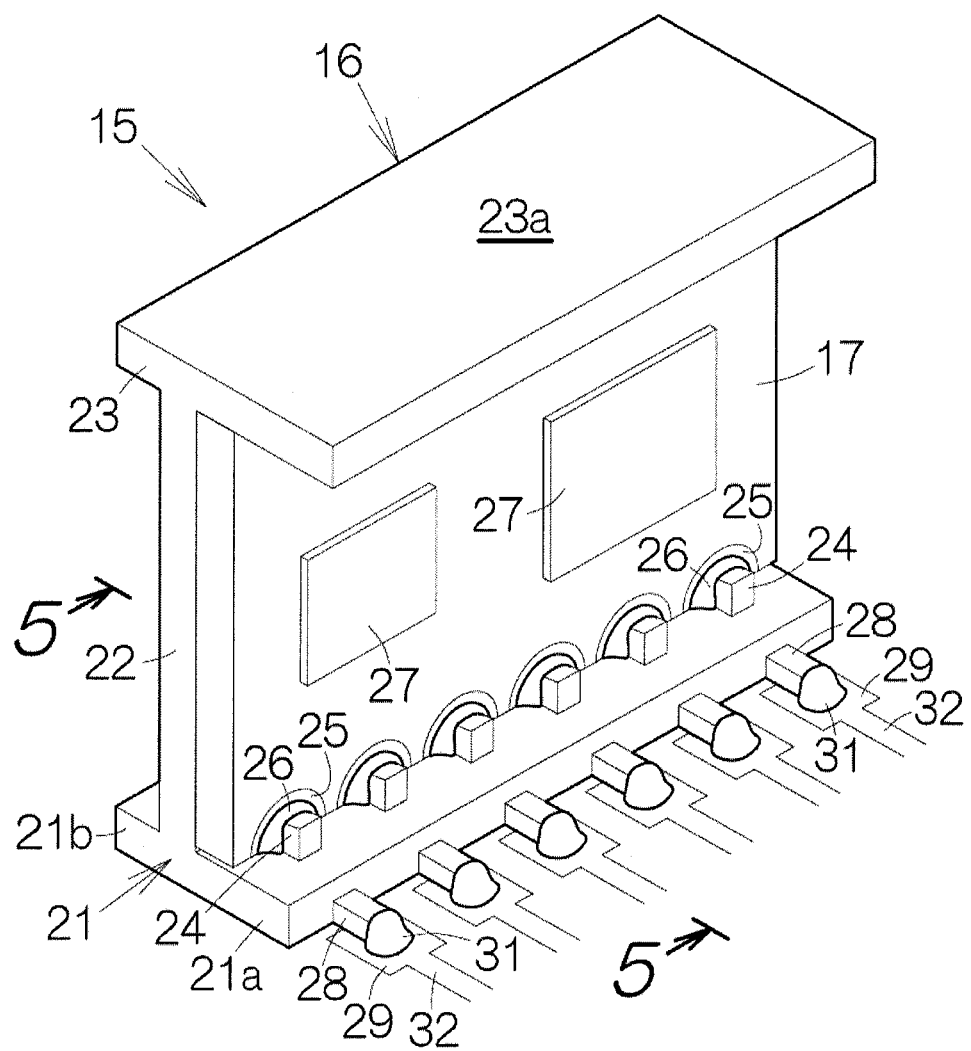
FIG. 3 schematically illustrates an external view of the structure of a printed circuit board module according to the first embodiment of the present invention.

FIG. 3 schematically illustrates the structure of the printed circuit board module 15 according to the first embodiment of the present invention. In the printed circuit board module 15, the mold 16 is provided with a base 21 that flatly spreads on the surface of the printed wiring board 14. The base 21 is received on the surface of the printed wiring board 14 that is a flat base object. This is how the base 21 stands erect on the surface of the printed wiring board 14. The mold 16 is provided with a side wall 22 that is integrated into the base 21 by integral molding. The side wall 22 is formed, for example, to be a flat plate. The side wall 22 stands erect from the top face of the base 21. The base 21 is partitioned into a first base 21a and a second base 21b, where the first base 21a is on the front side of the side wall 22 and the second base 21b is on the rear side of the side wall 22. Here, the width of the first base 21a defined in a second direction that is orthogonal to a first direction defined in a longitudinal direction of the base 21 is set to be larger than the width of the second base 21b defined in the second direction.

The mold 16 is provided with a top board 23 that is integrated with the top end of the side wall 22 by integral molding. The top board 23 spreads in parallel with the base 21. The top board 23 is formed, for example, to be a flat plate. On the top face of the top board 23, a flat surface 23a is formed facing upward and spreading to a certain extent. As will be described later, the flat surface 23a serves as an absorbent face. The mold 16 of such type is integrally molded from an insulative resin material. There is a certain amount of space between the base 21 and the top board 23. The printed circuit board 17 is fitted into this space. The backside of the printed circuit board 17 is received on the side wall 22. In this way, the printed circuit board 17 establishes a vertical posture along the side wall 22.

The mold 16 is provided with two or more conductive terminals 24 that protrude from the surface of the first base 21a, for example on the front side of the surface of the printed circuit board 17. The conductive terminals 24 are arranged in the first direction. The conductive terminals 24 are electrically connected to corresponding conductive pads 25 that are formed on the surface of the printed circuit board 17 in an independent manner. In order to establish the electric connection, a soldering material 26 is used. The conductive pads 25 are connected, for example, to the surface of the printed circuit board 17 or to the wiring pattern formed on the backside (not illustrated). The wiring pattern of such type is connected to the surface of the printed circuit board 17 or to an electronic chip 27 implemented on the backside.

On the other hand, the mold 16 is provided with two or more surface-implemented terminals 28 that protrude from the first base 21a along the assumed plane including the bottom face of the base 21. The surface-implemented terminals 28 are electrically connected to the corresponding conductive pads 29 that are formed on the surface of the printed wiring board 14. In order to establish the electric connection, a soldering material 31 is used. The conductive pads 29 are connected to a corresponding wiring pattern 32 that is formed on the surface of the printed wiring board 14. As illustrated in FIG. 4, the side wall 22 is made of, for example, a frame. In this way, a through hole 22a is formed on the side wall 22. In the through hole 22a, the electronic chip 27 implemented on the backside of the printed wiring board 14 is received.

As illustrated in FIG. 5, the conductive terminals 24 and the corresponding surface-implemented terminals 28 are integrated into the first base 21a. In other words, the conductive terminals 24 and the surface-implemented terminals 28 are partly embedded in the first base 21a. In this way, the other electronic components (not illustrated) on the printed wiring board 14 are connected to the electronic chip 27 on the printed circuit board 17. The conductive terminals 24 extend along the surface of the first base 21a. The conductive terminals 24 receive the lower end of the printed circuit board 17 by elastic deformation. The top end of the printed circuit board 17 is pressed against the top board 23 by the elasticity of the elastic terminal 24. In this way, the printed circuit board 17 is fitted in between the conductive terminals 24 and the top board 23 in a vertical posture.

Here, it is preferred that the width of the mold 16 from the rear edge of the second base 21b to the front end of the surface-implemented terminal 28 be approximately half the height from the surface of the printed wiring board 14 to the top board 23. When the width is set as above, the mold 16, i.e., the printed circuit board module 15, can stand erect on the surface of the printed wiring board 14. In this way, in the printed circuit board module 15, the first base 21a and the surface-implemented terminals 28 form a first support foot of the base 21 in a co-operating manner. In a similar manner, the second base 21b forms a second support foot of the base 21. The base 21, i.e., the printed circuit board module 15, can stand erect due to the first support foot and the second support foot.

As illustrated in FIG. 6, two or more notches 33 are formed at a lower end of the printed circuit board 17. The notches 33 determine the outline of the printed circuit board 17. Here, each of the notches 33 forms, for example, a half-cylindrical space. The notches 33 receive the corresponding conductive terminals 24. Due to the functioning of the notches 33 as described above, the displacement of the printed circuit board 17 in the first direction is regulated. Further, the printed circuit board 17 is sandwiched between the conductive terminals 24 and the top board 23. As a result, the printed circuit board 17 is prevented from falling out from the mold 16. On the surface of the printed circuit board 17, the above-described conductive pads 25 are formed around the notches 33.

Next, the way in which the motherboard 13 is manufactured will be described. First, the printed circuit board module 15 is assembled. As illustrated in FIG. 7, in the mold 16, the conductive terminals 24 extend along the surface of the first base 21a. A lower end of the inclined printed circuit board 17 is pushed against the conductive terminals 24. The conductive terminals 24 are received at the notches 33. In this way, the printed circuit board 17 is positioned with precision in the mold 16. The conductive terminals 24 elastically deform. The printed circuit board 17 rotates from an inclined posture to a vertical posture with respect to the conductive terminals 24. In this way, the backside of the printed circuit board 17 is received on the side wall 22. The top end of the printed circuit board 17 is also received on the top board 23. The printed circuit board 17 is fitted in between the conductive terminals 24 and the top board 23 by the elastic deformation of the conductive terminals 24. A soldering paste 34 may preliminarily be applied to the conductive pads 25 of the printed circuit board 17.

In this way, the assembled printed circuit board module 15 is carried onto the printed wiring board 14. As illustrated in FIG. 8, when the assembled printed circuit board module 15 is carried onto the printed wiring board 14 as above, for example, an automatic implementation robot 35 absorbs the flat surface 23a of the top board 23. On the other hand, a soldering paste (not illustrated) is preliminarily applied to the conductive pads 29 on the printed wiring board 14. Once the printed circuit board module 15 is arranged on a specific position of the printed wiring board 14, the surface-implemented terminals 28 are received by the soldering paste on the conductive pads 29. Due to the function of the base 21, the printed circuit board module 15 can stand erect. In this state, a reflowing process is performed on the printed wiring board 14. The solder of the soldering paste on the conductive pads 25 and the conductive pads 29 melts. Subsequently, the solder solidifies due to the cooling process. In this way, the printed circuit board module 15 is implemented on the printed wiring board 14.

According to the printed circuit board module 15 as described above, the base 21, the side wall 22, and the top board 23 are integrated by integral molding, and thus the printed circuit board module 15 can be assembled in a simple manner. The conductive terminals 24 are used for fitting the printed circuit board 17. The printed circuit board 17 is securely held between the conductive terminals 24 and the top board 23 by the elasticity of the conductive terminals 24. Further, due to the function of the notches 33, the printed circuit board 17 is positioned in the mold 16 in a simple manner.

Moreover, due to the function of the base 21, the printed circuit board module 15 can stand erect on the printed wiring board 14. The printed circuit board 17 establishes vertical posture. The packaging area is reduced on the printed wiring board 14. The packaging density improves. As a soldering paste is applied to the conductive pads 25 and the conductive pads 29, the implementation of the printed circuit board module 15 is completed by performing a reflowing process only once. The manufacturing process is simplified. Moreover, the top board 23 can be used for the absorption by the automatic implementation robot 35.

Figure 9:
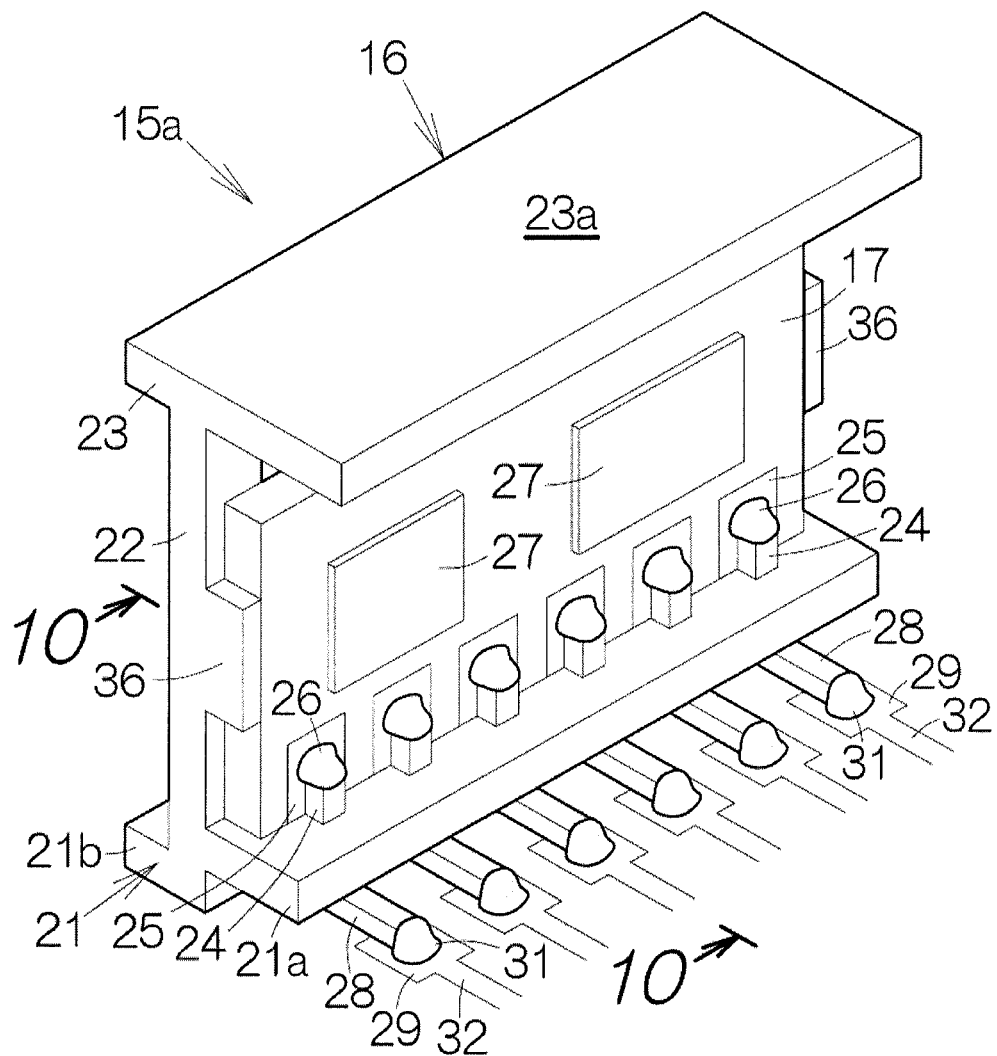
FIG. 9 schematically illustrates an external view of the structure of a printed circuit board module according to the second embodiment of the present invention.

FIG. 9 schematically illustrates the structure of a printed circuit board module 15a according to the second embodiment of the present invention. In the printed circuit board module 15a, the first base 21a is arranged with a specific height from the surface of the printed wiring board 14. The first base 21a and the second base 21b are arranged at different stages. The printed circuit board 17 is fitted in the space formed between the first base 21a and the top board 23 in a vertical posture. A pair of guide walls 36 is integrated into the side wall 22. The guide walls 36 protrude from the surface of the side wall 22. The printed circuit board 17 is accommodated between the guide walls 36. Due to the function of the guide walls 36, the printed circuit board 17 is positioned in the first direction in a simple manner.

Referring to FIG. 10, the conductive terminals 24 protruding from the surface of the first base 21a are pressed against the conductive pads 29 on the surface of the printed circuit board 17. Here, the conductive pads 29 are formed along the outline of a lower end of the printed circuit board 17. The printed circuit board 17 is pressed against the side wall 22 by the elasticity of the elastic terminal 24. On the other hand, the surface-implemented terminals 28 protrude from the backside of the first base 21a, and bend and extend along the above-mentioned assumed plane. As a result, the surface-implemented terminals 28 form a second support foot of the base 21 in a similar manner as above. It is to be noted that the same reference numerals are given to equivalent structures or composition elements as the above-described printed circuit board module 15. According to the printed circuit board module 15a described above, operational advantages are achieved in a similar manner as above.

Figure 11:
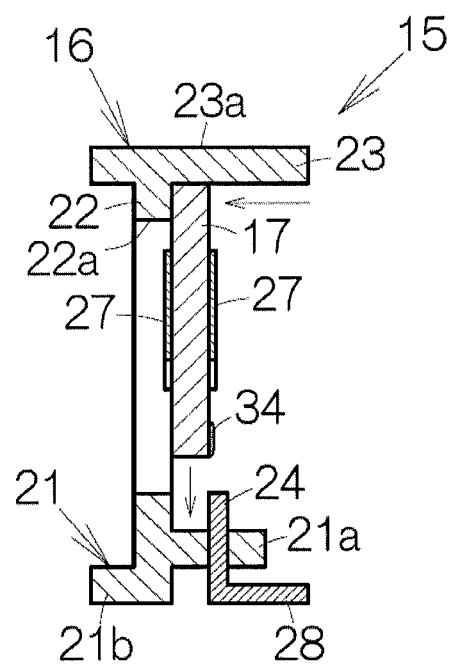
FIG. 11 is a section view schematically illustrating how a printed circuit board is fitted into a mold.

In the assembly of the printed circuit board module 15a, as illustrated in FIG. 11, the printed circuit board 17 is pressed against the side wall 22 above the top end of the conductive terminals 24. Here, due to the function of the guide walls 36, the printed circuit board 17 can be positioned in the first direction in the mold 16 in a simple manner. Subsequently, the printed circuit board 17 is pressed down towards the base 21 under the guidance of the guide walls 36. As a result, the printed circuit board 17 is fitted in between the conductive terminals 24 and the side wall 22 in a vertical posture. The conductive terminals 24 are positioned on the corresponding conductive pads 25 on the printed circuit board 17. After that, a reflowing process may be performed in a similar manner as above.

Figure 12:
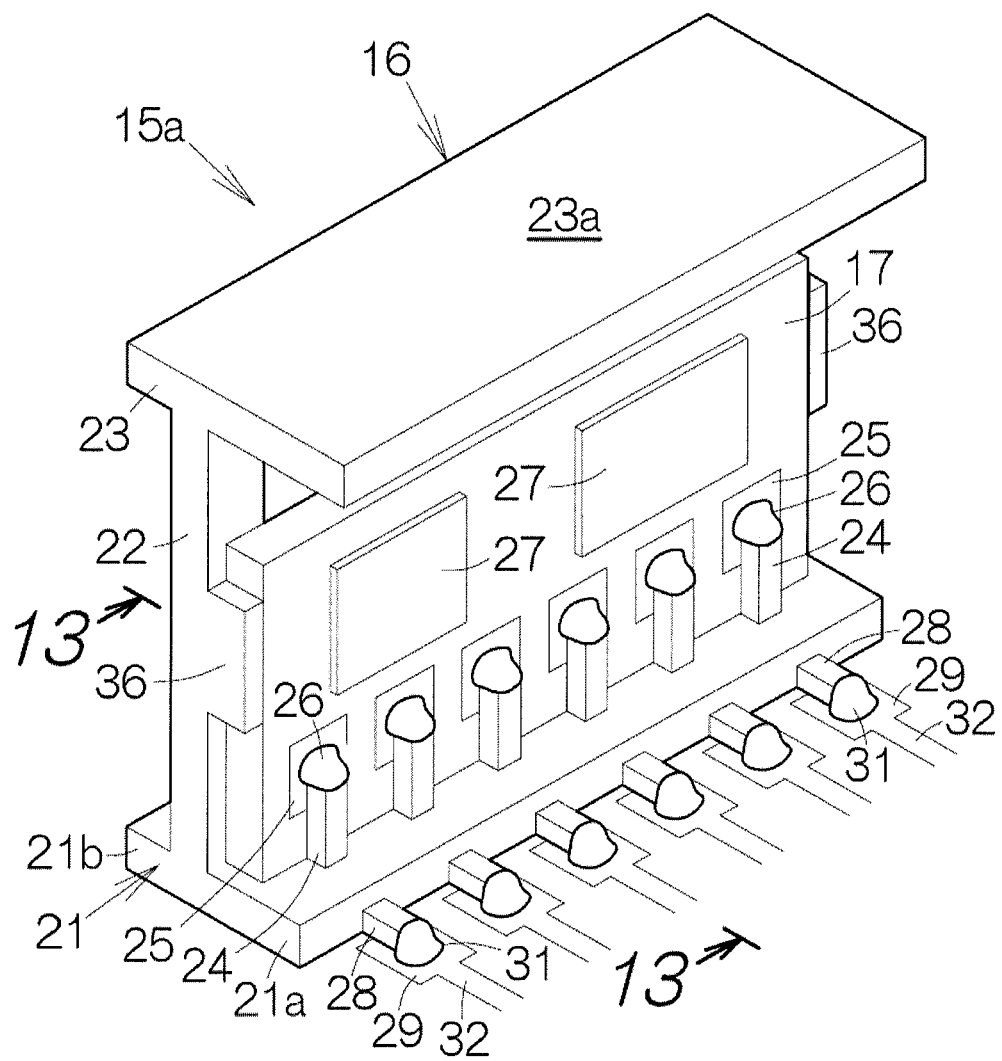
FIG. 12 schematically illustrates an external view of the structure of a printed circuit board module according to a modification of the second embodiment.
Figure 13:
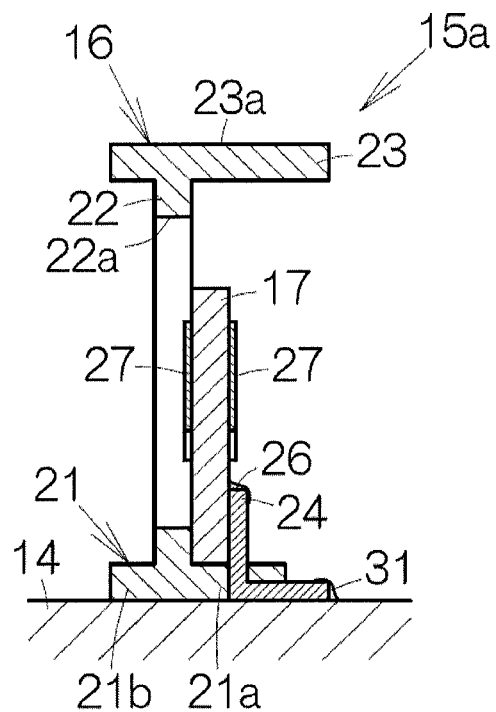
FIG. 13 is a section 13-13 of FIG. 12.

As illustrated in FIG. 12, in the printed circuit board module 15a, the first base 21a may be arranged at the same height as the second base 21b in a similar manner as the printed circuit board module 15. In this way, the first base 21a is received on the surface of the printed wiring board 14 in a similar manner as the above-described printed circuit board module 15. In further view of FIG. 13, the surface-implemented terminals 28 protrude from the front end of the first base 21a along the above-described assumed plane. It is to be noted that the same reference numerals are given to equivalent structures or composition elements of the above-described printed circuit board module 15. According to the printed circuit board module 15a described above, operational advantages are achieved in a similar manner as above.

Moreover, as illustrated in FIG. 14, in the printed circuit board module 15a, a through hole 37 may be formed on the first base 21a penetrating from the surface to the backside. The printed circuit board 17 is received in the through hole 37. In this case, the formation of the guide walls 36 onto the side wall 22 may be omitted. In further view of FIG. 15, the first base 21a is arranged at a certain height above the surface of the printed wiring board 14. Due to the function of the through hole 37, the printed circuit board 17 is positioned in the first direction. It is to be noted that the same reference numerals are given to equivalent structures or composition elements of the above-described printed circuit board module 15. According to the printed circuit board module 15a described above, operational advantages are achieved in a similar manner as above.

FIG. 16 schematically illustrates the structure of a printed circuit board module 15b according to the third embodiment of the present invention. The printed circuit board module 15b is provided with a mold 41. The mold 41 is provided with a base 42. The base 42 is a bottom face of a plate, and is received on the surface of the printed wiring board 14. The base 42 is provided with a first support foot 42a. The side wall 22 is integrated with the base 42 by integral molding in a similar manner as above. The top board 23 is integrated with the side wall 22 by integral molding. The mold 41 of such a type is integrally formed of an insulative resin material. The printed circuit board 17 is held on the side wall 22. The printed circuit board 17 extends from the top board 23 to the base 42.

Figure 17:
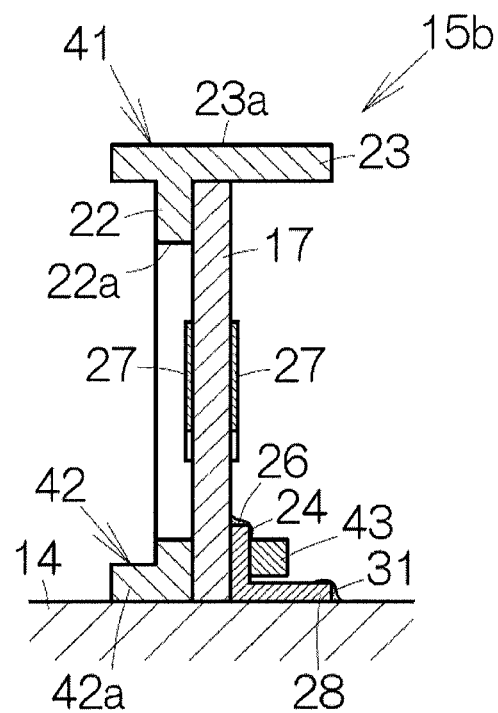
FIG. 17 is a section 17-17 of FIG. 16.

Two or more of the conductive terminals 24 extend in parallel along the surface of the printed circuit board 17. The conductive terminals 24 are fixed to the conductive pad 25 on the printed circuit board 17 by the above-mentioned soldering material 26. All the conductive materials 24 are linked by a holding mold 43. The holding mold 43 is made of an insulative resin material. In further view of FIG. 17, the conductive terminals 24 and the corresponding surface-implemented terminals 28 are integrated. The surface-implemented terminals 28 extend along the assumed plane that includes the bottom face of the base 42. In this way, the surface-implemented terminals 28 are connected to the conductive pads 29 on the printed wiring board 14. The surface-implemented terminals 28 form a second support foot. The surface-implemented terminals 28 and the first support foot 42a enable the base 42, i.e., the printed circuit board module 15b, to stand erect in a co-operating manner.

Figure 18:
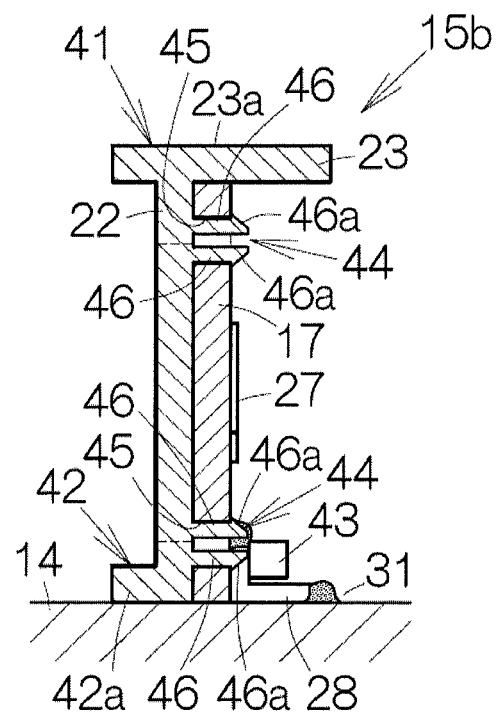
FIG. 18 is a section 18-18 of FIG. 16.

In further view of FIG. 18, protrusions 44 protrude from the surface of the side wall 22 in order to hold the printed circuit board 17. The protrusions 44 are arranged at the four corners on the surface of the side wall 22. The protrusions 44 are received at through holes 45 that penetrate the printed circuit board 17 from the surface to the backside. The protrusions 44 are provided with pairs of axis members 46 that inwardly face each other. The axis members 46 may undergo elastic deformation. At the tips of the axis members 46, latching pieces 46a that latch onto the surface of the printed circuit board 17 are formed. Due to the function of the latching pieces 46a, the printed circuit board 17 is prevented from falling out from the protrusion 44. In this way, the printed circuit board 17 is held onto the side wall 22, i.e., the mold 41.

In the assembly of the printed circuit board module 15b, first, the conductive materials 24 are soldered onto the surface of the printed circuit board 17. The conductive materials 24 are held by the holding mold 43. Next, the printed circuit board 17 is attached to the mold 41. In the attaching process, the through holes 45 are positioned at the protrusions 44. As illustrated in FIG. 19, when the latching pieces 46a are pushed into the through holes 45, the latching pieces 46a get close to each other due to the elastic deformation of the axis members 46. As a result, the latching pieces 46a are received in the through holes 45. When latching pieces 46a get out of the through holes 45, latching pieces 46a are received on the surface of the printed circuit board 17 due to the elastic restoring force of the axis members 46. In this way, the printed circuit board 17 is held in the mold 41. In this way, printed circuit board module 15b is assembled.

According to the printed circuit board module 15b as described above, the base 42, the side wall 22, and the top board 23 are integrated by integral molding, and thus the printed circuit board module 15b is structured in a simple manner. Further, the protrusions 44 are used to fit the printed circuit board 17. Due to the function of the protrusion 44, the printed circuit board 17 is positioned in the mold 41 in a simple manner. Moreover, due to the function of the base 42 and the surface-implemented terminals 28, the printed circuit board module 15b can stand erect on the printed wiring board 14. The packaging density improves. Moreover, the top board 23 can be used for the absorption by the automatic implementation robot 35 as described above.

In the printed circuit board module 15b, the mold 41 may be made of, for example, a metal material. A metal material includes, for example, aluminum and copper. As described above, the printed circuit board 17 is received on the side wall 22. When the motherboard 13 is operating, the electronic chip 27 generates thermal energy due to heat liberation. The thermal energy is transmitted to the side wall 22, i.e., the mold 41 via the printed circuit board 17. The thermal energy is radiated to the air from the mold 41, which has relatively large surface area. In this way, the electronic chip 27 is prevented from overheating.

What is claimed is:
1. A printed circuit board module comprising:
a base made of a resin;
a side wall made of the resin standing erect on the base, and integrated with the base by integral molding;
a top board made of the resin forming an upward-facing flat surface with a certain extension, forming a certain space between the top board and the base, and integrated with the side wall by integral molding;
an elastic conductive terminal protruding from a surface of the base; and
a printed circuit board accommodated in the certain space and sandwiched between the conductive terminal and the top board in a vertical posture via an elasticity of the conductive terminal.
2. The printed circuit board module according to claim 1, further comprising:

a notch determining an outline of the printed circuit board, and receiving the conductive terminal; and a conductive pad formed on a surface of the printed circuit board around the notch.

3. The printed circuit board module according to claim 1, further comprising:

a flat bottom face formed on the base and received on an object; and a surface-implemented terminal protruding from the base along a virtual plane that includes the bottom face, and integrated with the conductive terminal.

4. A printed circuit board unit comprising:

a printed wiring board;

a base received on a surface of the printed wiring board via a flat bottom face, the base having a first support foot;

a side wall standing erect on the base and integrated with the base by integral molding;

a top board forming an upward-facing flat surface with a certain extension and integrated with the side wall by integral molding;

a printed circuit board extending from the top board to the base and held on the side wall; and a second support foot fixed on a surface of the printed circuit board and enabling the side wall to stand erect in cooperation with the first support foot.

\* \* \* \* \*